United States Patent [19]

Boudewijns et al.

[11] Patent Number: 4,677,650
[45] Date of Patent: Jun. 30, 1987

[54] CHARGE COUPLED SEMICONDUCTOR DEVICE WITH DYNAMIC CONTROL

[75] Inventors: Arnoldus J. J. Boudewijns; Leonard J. M. Esser, both of Eindhoven, Netherlands

[73] Assignee: U.S. Philips Corporation, New York, N.Y.

[21] Appl. No.: 616,936

[22] Filed: Jun. 7, 1984

[30] Foreign Application Priority Data

Apr. 24, 1984 [NL]  Netherlands ................ 8401311

[51] Int. Cl.$^4$ ............... H04N 3/14; H01L 27/10; H01L 29/78; G11C 11/40
[52] U.S. Cl. .................................. 377/63; 377/54
[58] Field of Search ............... 377/63, 62, 54, 77, 377/64, 69, 79, 60; 357/24

[56] References Cited

U.S. PATENT DOCUMENTS

| | | | |
|---|---|---|---|
| 3,781,574 | 12/1973 | White et al. ................ | 377/63 |
| 3,913,077 | 10/1975 | Erb ............................. | 377/63 |
| 3,967,254 | 6/1976 | Kosonocky et al. ....... | 377/63 |
| 4,037,119 | 7/1977 | Schat .......................... | 377/61 |
| 4,094,009 | 6/1978 | Schneider et al. ......... | 357/24 |
| 4,178,614 | 12/1979 | Sauer ......................... | 357/24 LR |
| 4,559,550 | 12/1985 | Koike ......................... | 377/62 |
| 4,569,067 | 2/1986 | Gallup ........................ | 377/79 |
| 4,595,845 | 6/1986 | Briggs ........................ | 377/79 |

FOREIGN PATENT DOCUMENTS

2836080  10/1979  Fed. Rep. of Germany ........ 377/63

Primary Examiner—Stanley D. Miller
Assistant Examiner—Karl Ohralik
Attorney, Agent, or Firm—Marc D. Schechter

[57] ABSTRACT

In a CCD, especially in an image sensor device, the information density can be doubled by sequentially switching the electrodes between a clock signal and a reference signal. Clock signals and reference signals are obtained as output signals of a shift register controlled by a monophase or multiphase clock. The register is provided, for example, using C-MOS technology. Information at the input terminal of the first stage of the shift register in combination with clock pulse signals at the register clock, determine the output signals of the next stage of the shift register. Hence, these input signals determine the voltage variations at the electrodes connected to the outputs of the register stages.

7 Claims, 23 Drawing Figures

CHARGE COUPLED SEMICONDUCTOR DEVICE WITH DYNAMIC CONTROL

BACKGROUND OF THE INVENTION

The invention relates to a charge coupled semiconductor device. The device comprises a semiconductor body having a major surface at which at least one charge transport channel is defined. A system of electrodes is provided on the major surface. A control signal can be supplied to the electrodes for charge storage, and a clock signal can be supplied for charge transport.

This application is related to applications entitled "High Density CCD Image Sensor" (Ser. No. 615,843, filed May 31, 1984) and "Charge Coupled Device With Parallel Inputs" (Ser. No. 841,040, filed Mar. 17, 1986 or a continuation of Ser. No. 615,842, filed May 31, 1984.) Both of these related applications are assigned to the same assignee as this application and are incorporated by reference herein.

Charge coupled semiconductor devices are used in various fields of technology, for example as image sensing devices in solid state cameras, in which information is generated in a radiation-sensitive part of the device and is then stored, if required, in a memory part of the device. The information may then be converted electronically into a television signal, or may alternatively be stored temporarily, for example on a memory disk or memory tape.

Such a charge coupled device is described in the above-mentioned application entitled "High Density CCD Image Sensor". This application discloses, inter alia, a high resolution image sensing device in which the surface area is considerably reduced by separately driving the electrodes used for generating potential wells for charge storage and charge transport in the semiconductor body. In the embodiment shown therein, switching elements are driven from registers in such a manner that either a clock signal or a control signal is supplied at the electrodes of the image sensor device. The control signal is then variable.

SUMMARY OF THE INVENTION

In a device according to the invention, the semiconductor device comprises at least one shift register. The shift register can be controlled by a monophase or multiphase clock, and the shift register has several stages. The electrodes of the charge coupled device are separately electrically connected to stages of the shift register.

It should be noted that due to the periodicity of the shift registers, the inputs of one shift register stage may also be the output of another stage. As will appear from one of the embodiments, the input terminal of the shift register may be considered to form part of the first stage when a clock electrode is electrically connected thereto.

The invention is based on the recognition of the fact that the output voltages of the shift register can be used as both adjustment signals and clock pulse signals. Such a shift register can be operated so that the desired clock pulse signals and control signals are obtained at successive outputs.

Besides the advantages described in the application entitled "High Density CCD Image Sensor" with respect to reduction of the surface area, an image sensor device according to the invention has the further advantage that the electronic control means can be provided on a much smaller surface because the switching elements (MOS transistors) can be eliminated.

The shift register used is preferably a dynamic shift register. A dynamic shift register can be provided on a smaller surface.

In this connection, a dynamic shift register is to be understood to mean any switching device comprising several parts or stages. Corresponding parts or stages are switched on and off synchronously by clock signals. Between clock signals, the information in the parts or stages is retained by capacitive charge storage.

The shift register may be made in various ways, for example, so as to comprise several inverter circuits which are connected by switching transistors, which are controlled by the clock signal. The charge determining the state of the inverter circuit is then stored, for example, on a parasitic capacitance of this circuit. The output is connected to an electrode of the charge coupled semiconductor device.

In a preferred embodiment of such a device according to the invention, the inverter circuit comprises complementary MOS transistors. This has the advantage that a stage of the shift register can be made with only three transistors.

The space occupied by a stage of the shift register will generally have a larger width or length than the distance between two successive electrodes of the charge coupled device. In order to reduce the effective length of each shift register stage, regularly (for example every third or fourth stage) one of the electrodes of the electrode system is preferably used to connect two stages of the shift register. For n electrodes, n/2 stages of the shift register are then provided on both sides of the electrode system.

The stages of the shift register need not necessarily be inverting. However, since all outputs can then be simultaneously high or low, in the case of noninverting stages at least two shift registers are required. The two shift registers are then advantageously provided on both sides of the electrode system.

DESCRIPTION OF THE PREFERRED EMBODIMENTS

The Figures are schematic and are not drawn to scale. For the sake of clarity, thickness dimensions are greatly exaggerated. Semiconductor zones of the same conductivity type are generally cross-hatched in the same direction. In the Figures, corresponding parts are generally designated by the same reference numerals.

The principle of operation of the device according to the invention will first be explained with reference to FIGS. 1a–1m. In FIG. 1a a charge coupled semiconductor device 1 comprises a semiconductor body 5. The semiconductor body 5 is composed, for example, of an n-type silicon substrate 50 having a resistivity of approximately 10 Ω-cm and a p-type region 7 provided therein having a dopant concentration of approximately $3.10^{15}$ atoms/cm$^3$. At the major surface 8, the semiconductor body comprises at least one charge transport channel. In this case, the transport channel is n-type region 11 having a thickness of approximately 1 micron and an average impurity concentration of approximately $10^{16}$ atoms/cm$^3$.

The major surface 8 is covered with a layer 12 of insulating material, for example silicon oxide. There are provided on and in this insulating layer 12 a number of electrodes 21, 22, 23, 31, 32, and 33. By applying suitable voltages to these electrodes, potential wells can be produced in the semiconductor material for charge storage and charge transport.

According to the invention, each of the electrodes 21, 22, 23, 31, 32, and 33 can be switched so that a clock pulse signal or a control signal (reference level) is supplied thereto. For this purpose, the device is provided (see the copending application entitled "High Density CCD Image Sensor") with switching elements 26, 27, 28, 36, 37, and 38, for separately switching the electrodes between clock pulse lines (signal lines) 14, 17, and 19, and control lines (reference lines) 15 and 18. The switching elements are controlled by registers to be described more fully.

Further, the device is provided with an n-type source zone 92. An input signal can be supplied to source zone 92 via a connection 90. If the voltage at the gate electrode 91 is sufficiently high, a charge packet 25, whose size depends upon the input signal, can be transferred to a potential well under the electrode 33, which for this purpose also has a high voltage. Information under the electrode 21 can be read in a generally known manner, for example by an RC network comprising a resistor 96 and a capacitor 95 connected to the adjoining n-type region 93.

In FIGS. 1a to 1m, broken lines indicate the variation of the surface potential due to voltages at the electrodes 21, 22, 23, 31, 32, 33 and 91. The potential variation is represented in a generally known manner so that potential wells or troughs correspond to energy minima for electrons, and so correspond to parts of the semiconductor body which are located under an electrode at high voltage.

The broken line of FIG. 1a corresponds to the potential variation at an instant $t_1$. At the time $t_1$, the electrodes 21, 22, 23, 31, 32, and 33 are connected via the switching elements 26, 27, 28, 36, 37, and 38 to clock pulse signals at the lines 14, 17, and 19 so that potential wells are situated under the electrodes 21, 23, 31 and 33, and potential barriers for electrons are situated under the electrodes 22 and 32. Due to the fact that immediately before the instant $t_1$ the voltage at the electrode 91 has been high for some time, a charge packet 25 has been transferred to the potential well under the electrode 33. The size of the charge packet depends upon the input signal at the connection 90 of the n-type region 92 and upon the duration for which the electrode 91 has been at a high voltage. The potential wells under the electrodes 31, 23 and 21 are assumed to contain no charge or a negligibly small quantity of charge at the instant $t_1$.

FIG. 1b shows the potential variation in the device at the instant $t_2$. At the time $t_2$, due to clock signals at the lines 14, 17, and 19 voltages are supplied at the electrodes 21, 22, 23, 31, 32 and 33 so that potential wells are situated under the electrodes 23 and 33. Potential barriers are situated under the remaining electrodes. Therefore, the charge packet 25 is maintained under the electrode 33.

At the instant $t_3$ (FIG. 1c), the potential variation changes in such a manner that potential wells are formed under the electrodes 22, 23, 32, and 33. Potential barriers are formed under the electrodes 21 and 31. Consequently, the charge packet 25 is distributed over the potential wells under the electrodes 32 and 33.

FIG. 1d shows the potential variation at the instant $t_4$. Due to the clock voltages at the lines 14, 17 and 19, potential wells are situated under the electrodes 22 and 32. Potential barriers are situated under the electrodes 21, 23, 31, and 33. The charge packet 25 is now situated under the electrode 32, and has consequently shifted through one electrode distance with respect to the situation at the instant $t_1$ (FIG. 1a).

At the instant $t_5$ (FIG. 1e), potential barriers are situated under the electrodes 33 and 23. The charge packet 25 is situated in the potential well under the electrodes 31 and 32. The potential well under the electrodes 21 and 22 is assumed to contain no charge. Consequently, no output signal is detected either in the output circuit comprising, inter alia, the capacitance 95 and the resistor 96. Also at the instant $t_6$, when potential wells are situated under the electrodes 31 where the charge packet 25 is located (FIG. 1f), the potential well under the electrode 21 does not contain charge so no output signal is detected either.

In FIG. 1g, the potential variation due to clock signals at the lines 14, 17 and 19 is represented at an instant $t_7$. The potential variation at $t_7$ is analogous to that at the instant $t_1$ (FIG. 1a). In the same manner as described with reference to FIG. 1a, a charge packet 30 is now generated under the electrode 33. The charge packet 25 is meanwhile located in a potential well under the electrodes 23 and 31.

At the instants $t_8$, $t_9$, and $t_{10}$ (FIGS. 1h, 1i, and 1j), analogous potential variations to those at the instants $t_2$, $t_3$ and $t_4$ (FIGS. 1b, 1c, and 1d) occur in the semiconductor body. As a result, at the instant $t_{10}$ the charge packets 25 and 30 are concentrated in potential wells under the electrodes 22 and 32.

Without taking different steps, at the instant $t_{11}$ due to clock voltages at the lines 14, 17, and 19 the potential variation of the instant $t_5$ (FIG. 1e) would be repeated. In other words, a potential well would be formed under the electrodes 21 and 22, in which the charge packet 25 would be distributed. The charge variation under the electrode 21 would then give rise via the output circuit to an output signal at the capacitance 95.

For various reasons, it may be desirable that this does not happen immediately. For example, immediate readout will not be desirable if the semiconductor device is used as a delay line, if the information is to be processed in the form of stored charge at a latter instant, or if several of such devices are arranged in a multiplex circuit in which event the information can be read arbitrarily from one of the charge coupled devices.

In order to prevent an output signal from being generated, the charge packet 25 is continuously concentrated under the electrode 22. Before the instant $t_{11}$ a potential barrier is formed under the electrode 21.

In the aforementioned application entitled "High Density CCD Image Sensor", this is achieved in that the electrode 21 is connected via a switching element 26 to a control line (reference line) 18, which as a low potential. The potential variation on the left hand side of the electrode 21 is determined by the clock voltages at the lines 14, 17, and 19 (see FIG. 1k), and is now analogous to that at the instant $t_5$ (FIG. 1e). As a result, potential wells are formed under the electrodes 22, 31, and 32, and potential barriers are formed under the electrodes 23 and 33.

In order to maintain a potential well for the charge packet 25, a high potential is supplied at the electrode 22 according to the patent application by connecting the electrode 22 via a switching element 27 to a control line (reference line) 15 at high potential (see FIG. 1l) (instant $t_{12}$). On the left hand side of the electrode, the potential variation is now analogous to that of FIG. 1f (instant $t_6$).

At the instant $t_{13}$ (FIG. 1m), the electrode 23 is at a low control signal (via switching element 28 and reference line 18). As a result, a potential barrier is formed under the electrode 23 between the potential well under the electrode 22 and a potential well under the electrode 31 for the charge packet 30. At a next instant $t_{14}$, the potential at electrode 31 is no longer determined by the clock pulse voltages, but (via switching element 37) has a high voltage from control line 15.

At the instant $t_{13}$, the potential variation under the electrodes 31, 32, and 33 is still determined by clock signals at the lines 14, 17, and 19. In the same manner as in FIG. 1a, a charge packet 35 is generated under the electrode 33. After the electrode 31 has been connected to a high control signal ($t_{14}$), at following instants the electrodes 32 and 33 are connected to a low and a high control signal (reference level), respectively.

The patent application entitled "High Density CCD Image Sensor" further describes how the information in the form of charge packets can be read by connecting the switching elements 26, 27, 28, 36, 37 and 38 to the electrodes 21, 22, 23, 31, 32 and 33 gradually in the desired order of succession again to the lines 14, 17 and 19 for charge transport by clock pulse signals at these lines.

In order to simplify the further description of the device according to the invention, the potential variations at the instants $t_1$ to $t_{16}$, as shown in FIGS. 1a–1m, are represented below in the form of a table (Table 1). In Table 1, a "1" corresponds to a high voltage at the electrodes, and a "0" corresponds to a low voltage at the electrodes.

TABLE 1

| Instant | 33 | 32 | 31 | 23 | 22 | 21 | FIG. |
|---|---|---|---|---|---|---|---|
| $t_1$ | 1 | 0 | 1 | 1 | 0 | 1 | 1a |
| $t_2$ | 1 | 0 | 0 | 1 | 0 | 0 | 1b |
| $t_3$ | 1 | 1 | 0 | 1 | 1 | 0 | 1c |
| $t_4$ | 0 | 1 | 0 | 0 | 1 | 0 | 1d |
| $t_5$ | 0 | 1 | 1 | 0 | 1 | 1 | 1e |
| $t_6$ | 0 | 0 | 1 | 0 | 0 | 1 | 1f |
| $t_7$ | 1 | 0 | 1 | 1 | 0 | 1 | 1g |
| $t_8$ | 1 | 0 | 0 | 1 | 0 | 0 | 1h |
| $t_9$ | 1 | 1 | 0 | 1 | 1 | 0 | 1i |
| $t_{10}$ | 0 | 1 | 0 | 0 | 1 | 0 | 1j |
| $t_{11}$ | 0 | 1 | 1 | 0 | 1 | 0 | 1k |
| $t_{12}$ | 0 | 0 | 1 | 0 | 1 | 0 | 1l |
| $t_{13}$ | 1 | 0 | 1 | 0 | 1 | 0 | 1m |
| $t_{14}$ | 1 | 0 | 1 | 0 | 1 | 0 | 1m |
| $t_{15}$ | 1 | 0 | 1 | 0 | 1 | 0 | 1m |
| $t_{16}$ | 1 | 0 | 1 | 0 | 1 | 0 | 1m |

In Table 1, broken lines indicate how the charge packet is first displaced by alternating voltages from a potential well under the electrode 33 to a potential well under the electrode 22. After the charge packet is displaced to electrode 22, this charge packet 25 is stored under the electrode 22 and the charge packets 30 and 35 are stored under the electrodes 31 and 33 by sequentially fixing the electrode voltages. In the part of the table located on the right hand side below the dot-and-dash line, the electrode voltages are kept at a constant potential.

Figure 1:
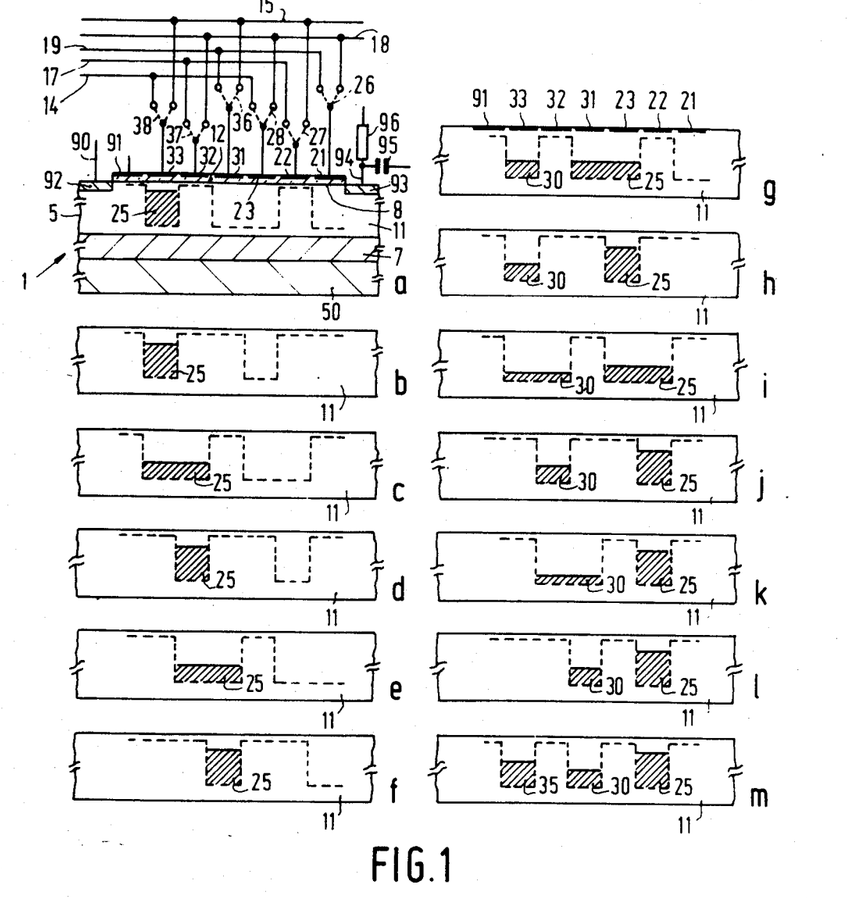
FIGS. 1a and 1m schematically show the principles of charge storage and charge transport for operation of a device according to the invention.
Figure 2:
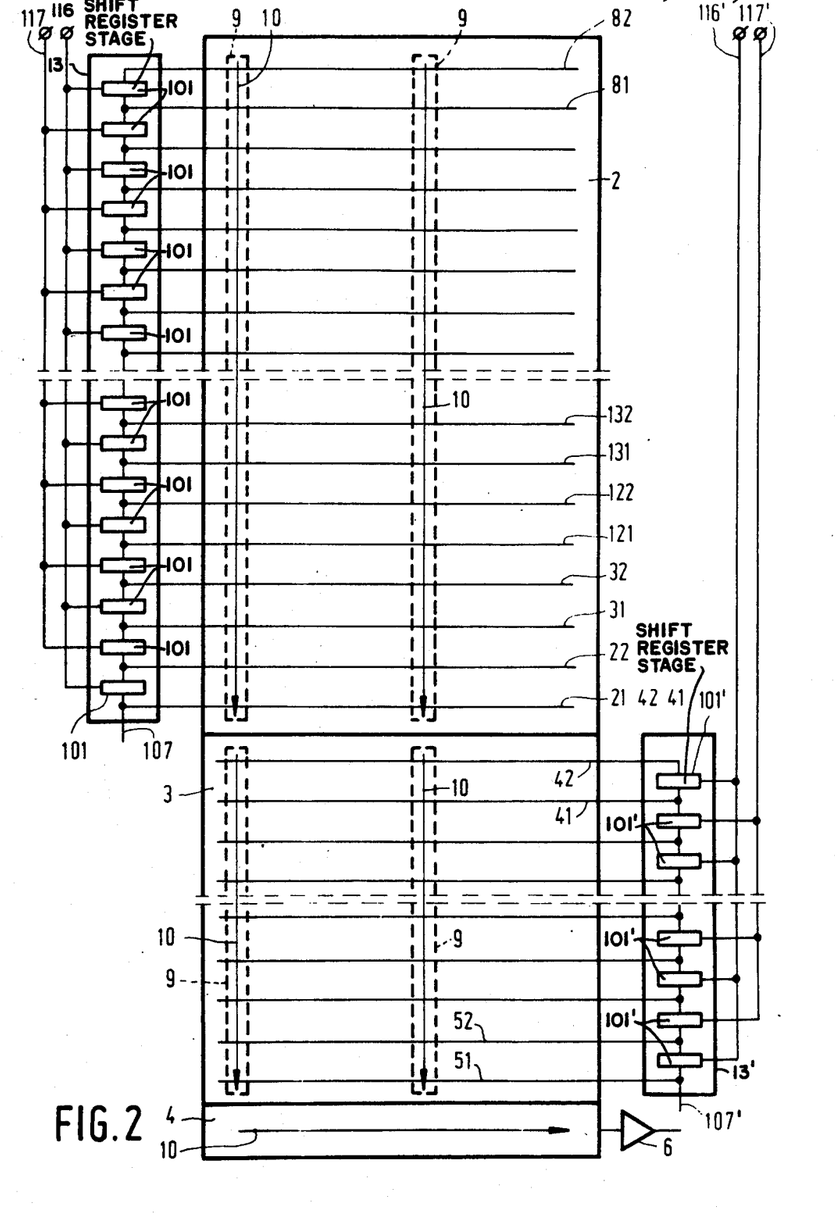
FIG. 2 is a schematic plan view of an image sensor device according to the invention.

FIG. 2 schematically shows an image sensing device according to the invention. Switching elements 26, 27, 28, 36, 37 and 38 of the kind shown in FIG. 1, and the references lines 15 and 18, may be omitted because the potentials applied to the electrode system are directly controlled by the outputs of a dynamic shift register.

In this case, the device is an image sensing device of the so-called frame field transfer type. Such an image sensing device comprises a radiation-sensitive sensor portion 2 and a memory portion 3. During a given exposure period, a pattern of electric charge carriers corresponding to the radiation image is formed in sensor portion 2. After the exposure period, the pattern of electric charge carriers is stored temporarily in the memory portion 3. From memory portion 3, the charge carriers are sequentially output by one or more shift registers 4. The charges can be read out by techniques known per se. If desired, the signals obtained may be amplified by the amplifier 6 before being further processed.

The image sensor device comprises (in the same manner as in FIG. 1) a semiconductor body. The semiconductor body is composed, for example, of an n-type silicon substrate and a p-type region provided therein. The p-type region may be provided, for example, by ion implantation followed by diffusion.

At the major surface of the semiconductor body there are defined a number of mutually separated, substantially parallel charge transport channels (designated in FIG. 2 by reference numerals 9) in which charge can be transported. Charge transport is shown schematically in FIG. 2 by arrows 10. In the present case, the charge transport device or CCD is formed by a CCD with bulk transport (PCCD or BCCD). The charge transport channels are then n-type regions 11, which are separated by p-type regions. The transport channels have depths of about 1 $\mu$m, while their widths amount to approximately 5 $\mu$m.

For a more detailed description of the device as to dimensions and doping concentrations, reference may be made to the patent entitled "High Density CCD Image Sensor."

The major surface 8 (see FIG. 1) is covered by a layer 12 of insulating material, for example silicon oxide. On and in this layer 12 are formed a number of electrodes. By applying suitable voltages to these electrodes, potential wells can be produced in the semiconductor material for charge storage and charge transport.

In the device shown in FIG. 2, which is suitable for four-phase transport, each so-called "storage element" in a channel 9 of the sensor portion 2 comprises two transport electrodes 21 and 22, 31 and 32, 121 and 122, 131 and 132 and 141 and 142, respectively, which are common to "storage elements" in several channels 9. Similarly, in the storage part 3 such "storage elements" are formed by transport electrodes 41 and 42, 51 and 52, etc.

In practice the device comprises a considerably larger number of electrodes than are shown here. In an image sensor device for the so-called PAL system, both the sensor part and the memory part comprise about 600 transport electrodes corresponding to 300 "storage elements" per charge transport channel.

In order to be able to selectively drive the electrodes of the charge coupled device 1, the latter has shift registers 13 and 13'. In this embodiment, the shift registers comprise inverter stages 101. According to the invention, the electrodes 22, 31, 32, 121, 122, 131, 132, 141 etc. of the image sensor part 2 are electronically connected directly to outputs of the inverter stages 101. The electrode 21 is connected to the input terminal 107 (and hence to the first stage) of the shift register 13.

In the same manner, electrodes 52 . . . , 41 and 42 of the memory portion 3 are electrically connected to outputs of stages 101' of a second register 13'. Register 13' controls the memory portion 3. In this case, the transport electrode 51 is connected to the input terminal 107' of the shift register 13'.

Figure 3:
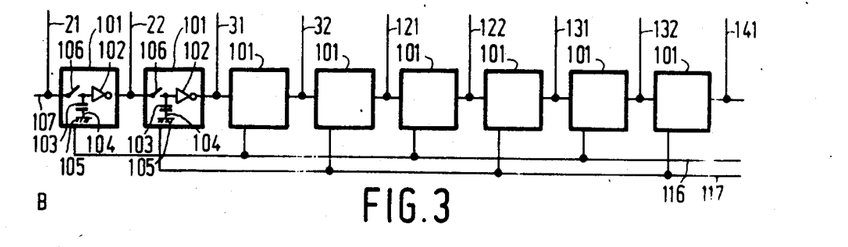
FIG. 3 schematically shows a shift register controlled by a two-phase clock signal. The shift register controls the device shown in FIG. 2.

Each stage 101 of the register 13 in this embodiment consists of an inverter circuit 102. (FIG. 3.) Inverter 102 is connected via a switching element 106 (for example a MOS transistor) to an input signal. For the first stage of the register 13 the input signal is suppled at the input terminal 107. For the remaining stages the input voltage is supplied by the output of the preceding stage.

Each of the stages retains its voltage at the output via a generally parasitic capacitance 103 at the input of the inverter circuit 102. As shown in FIG. 3, capacitance 103 is connected via a lead 104 to ground 105. This capacitance 103 is sufficiently large to retain the desired potential at the output for a sufficiently long time.

The switching elements 106 are switched on and switched off by clock voltages at the clock lines 116 and 117. If, for example, the clock line 116 is switched so that the switching elements 106 are closed, the output of the first stage reaches a level (high (1) or low (0)) which is determined by the signal at the input terminal 107. The output of the second stage remains unchanged, just like all the other outputs of stages controlled by the clock line 117. The outputs of all the other stages controlled by the clock line 116 may change depending upon the levels at the outputs of the preceding stages.

For a more extensive description of dynamic shift registers of this kind, reference may be made to the book *MOS Integrated Circuits* by W. M. Penney and L. Lau, (R. E. Krieger Publishing Company, 1979, pages 260 et seq.).

It is possible to connect all of the stages 101 in the register 13 by activating clock signals at the clock line 116 and the clock line 117 simultaneously so that at a low level (0) at the input terminal 107 will produce a 010101010 pattern at the electrodes 21, 22, 31, 32, 121, 122, 131, 132, and 141 (see Table 2, below line a). If this pattern is maintained, integration takes place in the image sensor part 2 under the even-numbered 22, 32, 122, and 132. When a high level (1) is supplied at the input terminal 107, a complementary pattern can be obtained at the electrodes so that integration is possible under the odd numbered electrodes (21, 31, 121, 131, and 141).

For further processing, the stored charge (which corresponds to a sensed image) is in practice generally converted into a signal for a television receiver. It is then common practice to alternately activate the even-numbered and the odd-numbered lines of the image screen. For this so-called interlacing, it is therefore desirable to transfer charge from the radiation-sensitive portion of the device to a storage register twice within each image period. Charge is generated alternately in different parts of the radiation-sensitive portion. For this purpose, in the image sensor device, the charge packets of one image period are collected alternately at different areas, i.e. alternately under the electrodes 21, 31, 121 etc., and the electrodes 22, 23, 122 etc.

At the instant $t_1$ (Table 2, FIGS. 2 and 3), the electrodes 22, 32, 122, 132 are at a high potential. In other words, potential wells are formed under these electrodes in which charge generated by incident radiation is collected. Due to the fact that the voltage at the input terminal 107 does not change during the instants $t_2$ and $t_3$, this situation is maintained (lines a, b, and c).

At the instant $t_4$, the signal at the input terminal 107 becomes high (1). Due to the fact that the clock line 116 ($\psi 1$) is not active, the output of the first stage does not change. However, the width of the potential well under the electrode 22 is effectively doubled due to the fact that now a potential well is situated under both the electrodes 21 and 22. Therefore, the charge is distributed under both electrodes 21 and 22 (line d).

TABLE 2

| Instant | Clock | input (107) electrode 21 | 22 | 31 | 32 | 121 | 122 | 131 | 132 | 141 | Line |
|---|---|---|---|---|---|---|---|---|---|---|---|
| $t_1$ | $\psi 1$ | 0 | 1 | 0 | 1 | 0 | 1 | 0 | 1 | 0 | a |
| $t_2$ | $\psi 2$ | 0 | 1 | 0 | 1 | 0 | 1 | 0 | 1 | 0 | b |
| $t_3$ | $\psi 1$ | 0 | 1 | 0 | 1 | 0 | 1 | 0 | 1 | 0 | c |
| $t_4$ | $\psi 2$ | 1 | 1 | 0 | 1 | 0 | 1 | 0 | 1 | 0 | d |
| $t_5$ | $\psi 1$ | 1 | 0 | 0 | 1 | 0 | 1 | 0 | 1 | 0 | e |
| $t_6$ | $\psi 2$ | 0 | 0 | 1 | 1 | 0 | 1 | 0 | 1 | 0 | f |
| $t_7$ | $\psi 1$ | 0 | 1 | 1 | 0 | 0 | 1 | 0 | 1 | 0 | g |
| $t_8$ | $\psi 2$ | 1 | 1 | 0 | 0 | 1 | 1 | 0 | 1 | 0 | h |
| $t_9$ | $\psi 1$ | 1 | 0 | 0 | 1 | 1 | 0 | 0 | 1 | 0 | i |
| $t_{10}$ | $\psi 2$ | 0 | 0 | 1 | 1 | 0 | 0 | 1 | 1 | 0 | j |

TABLE 2-continued

| Instant | Clock | input (107) electrode 21 | \multicolumn{8}{c|}{Electrodes} | Line |
|---|---|---|---|---|---|---|---|---|---|---|---|
| | | | 22 | 31 | 32 | 121 | 122 | 131 | 132 | 141 | |
| $t_{11}$ | $\psi 1$ | 0 | 1 | 1 | 0 | 0 | 1 | 1 | 0 | 0 | k |
| $t_{12}$ | $\psi 2$ | 1 | 1 | 0 | 0 | 1 | 1 | 0 | 0 | 1 | l |
| $t_{13}$ | $\psi 1$ | 1 | 0 | 0 | 1 | 1 | 0 | 0 | 1 | 1 | m |
| $t_{14}$ | $\psi 2$ | 0 | 0 | 1 | 1 | 0 | 0 | 1 | 1 | 0 | n |
| $t_{15}$ | $\psi 1$ | 0 | 1 | 1 | 0 | 0 | 1 | 1 | 0 | 0 | o |
| $t_{16}$ | $\psi 2$ | 1 | 1 | 0 | 0 | 1 | 1 | 0 | 0 | 1 | p |
| $t_{17}$ | $\psi 1$ | 1 | 0 | 0 | 1 | 1 | 0 | 0 | 1 | 1 | q |
| $t_{18}$ | $\psi 2$ | 1 | 0 | 1 | 1 | 0 | 0 | 1 | 1 | 0 | r |
| $t_{19}$ | $\psi 1$ | 1 | 0 | 1 | 0 | 0 | 1 | 1 | 0 | 0 | s |
| $t_{20}$ | $\psi 2$ | 1 | 0 | 1 | 0 | 1 | 1 | 0 | 0 | 1 | t |
| $t_{21}$ | $\psi 1$ | 1 | 0 | 1 | 0 | 1 | 0 | 0 | 1 | 1 | u |
| $t_{22}$ | $\psi 2$ | 1 | 0 | 1 | 0 | 1 | 0 | 1 | 1 | 0 | v |
| $t_{23}$ | $\psi 1$ | 1 | 0 | 1 | 0 | 1 | 0 | 1 | 0 | 0 | w |
| $t_{24}$ | $\psi 2$ | 1 | 0 | 1 | 0 | 1 | 0 | 1 | 0 | 1 | x |
| $t_{25}$ | $\psi 1$ | 1 | 0 | 1 | 0 | 1 | 0 | 1 | 0 | 1 | y |
| $t_{26}$ | $\psi 2$ | 1 | 0 | 1 | 0 | 1 | 0 | 1 | 0 | 1 | z |

At the instant $t_5$, the output of the first stage becomes low (0) by activating the clock line 116 ($\psi 1$) while keeping the input signal high (1). As a result, the charge is shifted to a potential well under the electrodes 21 (line e) because the electrode 22 becomes low (0).

At the instant $t_6$ (line f), the input terminal has become low (0), but this does not change the output of the first stage because $\psi_1$ (clock line 116) is not active. However, the potential well under the electrode 21 has disappeared. Nevertheless, due to synchronization between the registers 13 and 13', a potential well has been formed under the electrodes 41 and 42 in the memory portion 3 (FIG. 2). The charge is now stored in this potential.

Due to the fact that $\psi_2$ (clock line 117) is now active, the change of the output voltage of the first stage, in other words the voltage at the electrode 22, is passed on via the inverter stage to the third stage. As a result, the electrode 31 becomes high (1), while $\psi_2$ does not change the electrode 32 which also remains high (1).

In substantially the same manner as described with reference to FIG. 1 and Table 1, the charge packets situated under the even-numbered electrodes 22, 32, 122, and 132 are now transported to the memory portion by generating (by properly alternating the signal at the input terminal 107) such a pattern at the electrodes 21, 22, 31, 32, 121, 122, 131, 132, and 141 that the charge packets are transported one by one. In this embodiment, however, the charge packets are held in potential wells which are always under two electrodes during transport.

In Table 2 a broken line again indicates how the charge packet stored under the electrode 132 is transported. This packet reaches at the instant $t_{16}$ (line p) a potential well under the electrodes 21 and 22. The input terminal 107 (electrode 21) is high (1) at that instant and now remains high so that at the instant $t_{17}$ upon activation $\psi_1$ (clock line 116) the output of the first stage 101 of the shift register 13 becomes low (0) (line q). As a result, at the instant $t_{18}$ the output of the next stage and hence the electrode 31 becomes high (1) (line r) under the influence of $\psi_2$ (clock line 117). Similar changes take place in the following stages at the instants $t_{19}$ to $t_{23}$ until at the instant $t_{24}$ (line x) the electrodes 21, 22, 31, 32, 121, 122, 131, 132, and 141 have a 101010101 pattern. Now, during the instants $t_{24}$ to $t_{26}$ (lines x, y, and z) charge is integrated under the odd-numbered electrodes.

Figure 4:
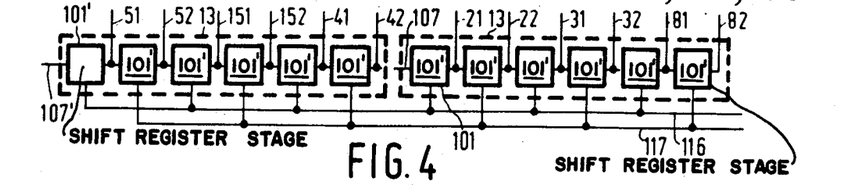
FIG. 4 schematically shows a variation of the shift register shown in FIG. 3.

FIG. 4 and Table 3 (for a slightly different device) indicate how integration control, charge transport, and charge storage are achieved in a complete image sensor device. The device differs from that shown in FIGS. 2 and 3 in that the electrodes 21 and 51 are now not connected to the input terminals 107 and 107' of the registers 13 and 13', but are driven by the outputs of the first stages in each of these registers. For the sake of simplicity, the device is limited to an image sensor portion and a memory portion each having six electrodes.

At the instant $t_1$ (line a in Table 3), the electrodes 22, 32 and 82 in the image sensor portion are high (1) so that a charge pattern corresponding to the image to be displayed is collected under these electrodes. The electrodes 22, 32 and 82 remain at this high voltage during the period $t_1$ to $t_3$ because the input terminal 107 of the register 13 remains at a high voltage (1).

The voltage at input 107 becomes low (0) at $t_4$. However, due to the fact that $\psi_2$ is high (line d), the low voltage at 107 does not yet change the electrode 22.

In the memory portion, the electrodes 51, 52, 151, 152, 41 and 42 are furnished with clock signals, inter alia, due to the fact that the voltage at the input terminal 107' alternates periodically between high and low in such a manner that at the instant $t_6$ a potential well is situated under the electrode 42, while a potential barrier is situated under the electrodes 41 and 152 (line f). In fact, at the instant $t_5$, due to the fact that the input terminal 107 becomes low and the clock line 116 ($\psi_1$) becomes high, the output of the first stage 101 of the register 13 (and hence the electrode 21) becomes high. The charge packet initially present under the electrode 22 is now distributed under the electrodes 21 and 22 (line e).

At the instant $t_6$, the charge packet is situated, due to the choice of clock pulse signals, in a potential well under the electrodes 42 and 21. Subsequently, it is transported during the instant $t_7$ to $t_{11}$ to a potential well under the electrodes 51 and 52.

Meanwhile, by supplying a periodical signal at the input terminal 107, the electrodes 31, 32, 81 and 82 are also furnished in a similar manner with clock pulse signals so that charges generated under the electrodes 32 and 82 are also transported to the memory part. These charges are stored therein under the electrodes 151 and 41, respectively (Table 3, line p.)

It should be noted that during transport, the potential wells and the potential barriers have a widths of two electrodes. During storage, the widths are equal to only one electrode.

From the instant $t_{10}$ (line j), the input 107' of a register 13' becomes temporarily low (0). This does not change the electrode 51 at $t_{10}$ because $\psi_2$ (clock line 117) is active at that instant. At the instant $t_{11}$, however, the clock line 116 ($\psi_1$) becomes high, and hence the output of the first stage becomes high and so the electrode 51 also becomes high (1).

switching behavior is determined by the clock pulse electrodes 116 and 117 which switch on or off an n-type MOS transistor 106 so that information from the preceding stage is passed on to the common gate electrode

TABLE 3

| | | | | Electrodes | | | | | | | | | | | |
|---|---|---|---|---|---|---|---|---|---|---|---|---|---|---|---|
| | | | | memory part | | | | | image sensor part | | | | | | |
| Instant | Clock | 107' | 107 | 51 | 52 | 151 | 152 | 41 | 42 | 21 | 22 | 31 | 32 | 81 | 82 | Line |
| $t_1$ | $\psi 1$ | 1 | 1 | 0 | 0 | 1 | 1 | 0 | 0 | 0 | 1 | 0 | 1 | 0 | 1 | a |
| $t_2$ | $\psi 2$ | 0 | 1 | 0 | 1 | 1 | 0 | 0 | 1 | 0 | 1 | 0 | 1 | 0 | 1 | b |
| $t_3$ | $\psi 1$ | 0 | 1 | 1 | 1 | 0 | 0 | 1 | 1 | 0 | 1 | 0 | 1 | 0 | 1 | c |
| $t_4$ | $\psi 2$ | 1 | 0 | 1 | 0 | 0 | 1 | 1 | 0 | 0 | 1 | 0 | 1 | 0 | 1 | d |
| $t_5$ | $\psi 1$ | 1 | 0 | 0 | 0 | 1 | 1 | 0 | 0 | 1 | 1 | 0 | 1 | 0 | 1 | e |
| $t_6$ | $\psi 2$ | 0 | 1 | 0 | 1 | 1 | 0 | 0 | 1 | 1 | 0 | 0 | 1 | 0 | 1 | f |
| $t_7$ | $\psi 1$ | 0 | 1 | 1 | 1 | 0 | 0 | 1 | 1 | 0 | 0 | 1 | 1 | 0 | 1 | g |
| $t_8$ | $\psi 2$ | 1 | 0 | 1 | 0 | 0 | 1 | 1 | 0 | 0 | 1 | 1 | 0 | 0 | 1 | h |
| $t_9$ | $\psi 1$ | 1 | 0 | 0 | 0 | 1 | 1 | 0 | 0 | 1 | 1 | 0 | 0 | 1 | 1 | i |
| $t_{10}$ | $\psi 2$ | 0 | 1 | 0 | 1 | 1 | 0 | 0 | 1 | 1 | 0 | 0 | 1 | 1 | 0 | j |
| $t_{11}$ | $\psi 1$ | 0 | 1 | 1 | 1 | 0 | 0 | 1 | 1 | 0 | 0 | 1 | 1 | 0 | 0 | k |
| $t_{12}$ | $\psi 2$ | 0 | 0 | 1 | 0 | 0 | 1 | 1 | 0 | 0 | 1 | 1 | 0 | 0 | 1 | l |
| $t_{13}$ | $\psi 1$ | 0 | 0 | 1 | 0 | 1 | 1 | 0 | 0 | 1 | 1 | 0 | 0 | 1 | 1 | m |
| $t_{14}$ | $\psi 2$ | 0 | 1 | 1 | 0 | 1 | 0 | 0 | 1 | 1 | 0 | 0 | 1 | 1 | 0 | n |
| $t_{15}$ | $\psi 1$ | 0 | 1 | 1 | 0 | 1 | 0 | 1 | 1 | 0 | 0 | 1 | 1 | 0 | 0 | o |
| $t_{16}$ | $\psi 2$ | 0 | 0 | 1 | 0 | 1 | 0 | 1 | 0 | 0 | 1 | 1 | 0 | 0 | 1 | p |
| $t_{17}$ | $\psi 1$ | 0 | 0 | 1 | 0 | 1 | 0 | 1 | 0 | 1 | 1 | 0 | 0 | 1 | 1 | q |
| $t_{18}$ | $\psi 2$ | 0 | 0 | 1 | 0 | 1 | 0 | 1 | 0 | 1 | 0 | 0 | 1 | 1 | 0 | r |
| $t_{19}$ | $\psi 1$ | 0 | 0 | 1 | 0 | 1 | 0 | 1 | 0 | 1 | 0 | 1 | 1 | 0 | 0 | s |
| $t_{20}$ | $\psi 2$ | 1 | 0 | 1 | 0 | 1 | 0 | 1 | 0 | 1 | 0 | 1 | 0 | 0 | 1 | t |
| $t_{21}$ | $\psi 1$ | 1 | 0 | 0 | 0 | 1 | 0 | 1 | 0 | 1 | 0 | 1 | 0 | 1 | 1 | u |
| $t_{22}$ | $\psi 2$ | 0 | 0 | 0 | 1 | 1 | 0 | 1 | 0 | 1 | 0 | 1 | 0 | 1 | 0 | v |
| $t_{23}$ | $\psi 1$ | 0 | 0 | 1 | 1 | 0 | 0 | 1 | 0 | 1 | 0 | 1 | 0 | 1 | 0 | w |
| $t_{24}$ | $\psi 2$ | 1 | 0 | 1 | 0 | 0 | 1 | 1 | 0 | 1 | 0 | 1 | 0 | 1 | 0 | x |

The electrode 52 remains high at $t_{11}$, but becomes low at the instant $t_{12}$ by the activation of $\psi_2$, even though there is no change at the input terminal 107'. At the instant $t_{13}$, the electrode 151 becomes permanently high, while at $t_{14}$ the electrode 152 becomes permanently low so that a potential well for the next charge packet is formed under the electrode 151. This is continued until all electrodes in the memory part have alternately high and low potentials, and the charge packets are transported from the image sensor part to the memory part (instant $t_{16}$, line p).

The input 107 becomes low at the instant $t_{16}$, so that in the same manner as just described for the memory part the electrodes in the image sensor part are brought again to alternately high and low voltages ($t_{17}$ to $t_{21}$, line q to line u). To provide interlacing, the odd-numbered electrodes 21, 31 and 81 now have high potentials. From the instant $t_{20}$, the input terminal 107' of the register 13' is no longer kept at a low level (0), but again such voltages are supplied that transport or clock signals are sequentially applied again at the electrodes 51, 52, 151, 152, 41, and 42.

Figure 5:
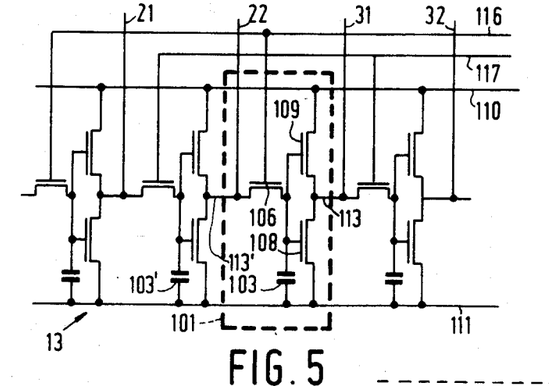
FIG. 5 schematically shows a circuit making up the shift register shown in FIGS. 2, 3 and 4.

FIG. 5 shows (in part) a preferred embodiment of the register 13. In this embodiment, the register utilizes C-MOS technology. Each stage 101 of the register comprises an inverter circuit. The inverter circuit consists of a p-type MOS transistor 109 and an n-type MOS transistor 108 which are connected in series between a positive supply line 110 and a ground 111. The gate electrodes of the transistors 108 and 109 are connected to each other. The output of the inverter circuit (point 113, at which the sources or drains of the transistors 108 and 109 are connected) determines the voltage at the electrodes 21, 22, 31, and 32 of the charge coupled semiconductor device.

This voltage is maintained due to the fact that, depending upon the condition of the output (high or low), a parasitic capacitance 103 is charged or not charged by the switching behavior of the inverter circuit. This of the transistors 108 and 109.

If, for example, the clock line 116 becomes high, the transistor 106 becomes conducting (analogous to switching on the switching elements 106 in FIG. 3). Depending upon the voltage at the electrode 22, the output 113 assumes a complementary voltage by the operation of the inverter circuit 108 and 109. As described above, however, output 113 changes only if the output 113' of the preceding stage was changed by activation of the clock pulse line 117.

Figure 6:
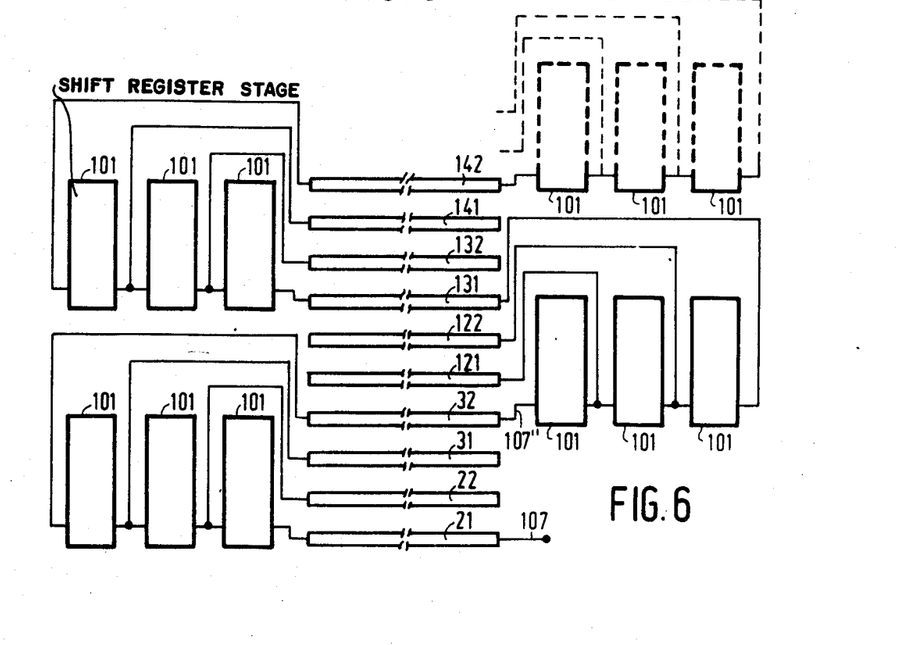
FIG. 6 schematically shows a variation of a part of the image sensor device shown in FIG. 2.

FIG. 6 shows an equivalent of a part of the device shown in FIG. 2, in which parts of the register 13 are provided on both sides of the system of electrodes 21, 22 . . . 141, and 142. For the sake of simplicity, in this embodiment no clock lines are shown.

The first electrode 21 is directly controlled by the input terminal 107. In this embodiment, the electrode 21 is located between the input terminal 107 and the actual input of the first stage 101, but this is not necessary. The electrodes 22, 31, and 32 are connected, as in FIG. 2, to the outputs of the first, and the second and the third stages, respectively.

The other end of the electrode 32 is connected to an input terminal 107" of a second series of three stages 101. The outputs of the second set of stages determine the voltages at the electrodes 121, 122 and 131.

The electrode 131 forms, in turn, a connection between the output of the second subregister and the input of a next subregister of three stages 101. In this manner, the register 13 can be subdivided into a number of subregisters, which are provided on both sides of the electrode system. This is advantageous from a viewpoint of ease of layout.

Of course, the invention is not limited to the embodiments shown here. Instead of a two-phase clock, a three-phase clock, a four-phase clock, or even a monophase clock may alternatively be chosen for controlling the register 13.

Figure 7:
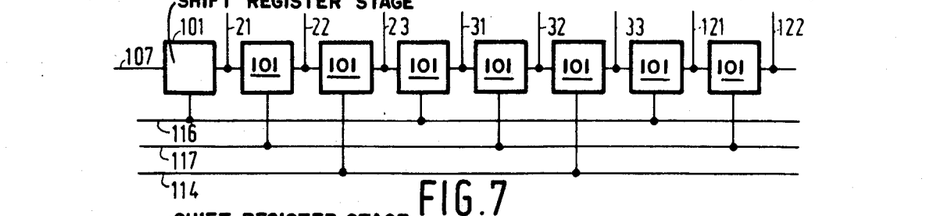
FIG. 7 schematically shows a shift register controlled by a three-phase clock signal.

FIG. 7 shows a part of a register 13 with a three-phase clock with clock lines 116 ($\psi_1$), 117 ($\psi_2$), and 114 ($\psi_3$). Table 4 shows, in the same manner as Tables 2 and 3, the switching behavior for three-phase transport.

Figure 8:
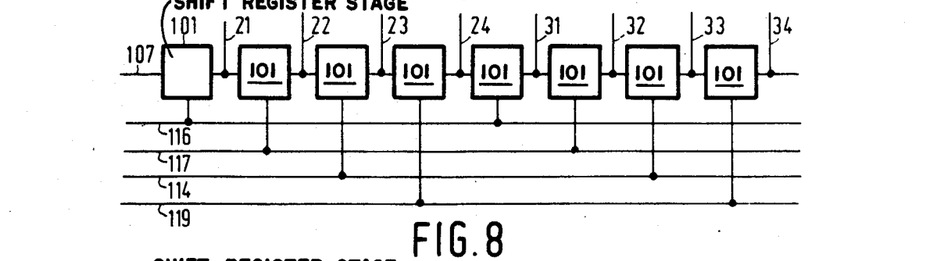
FIG. 8 schematically shows a shift register controlled by a four-phase clock signal.

In a similar manner, FIG. 8 shows a part of a register 13 with four-phase clock with clock electrodes 116 ($\psi_1$), 117 ($\psi_2$), 114 ($\psi_3$) and 119 ($\psi_4$). The register furnish the electrodes 21, 22, 23, 24, 31, 32, 33, and 34 with voltages for four-phase transport. The associated switching behavior is shown in Table 5.

It is alternatively possible to use a register 13 which is controlled by a monophase clock. Monophase registers can only be used when the stages 101 change their stages with such a delay that the change of one stage due to the activation of a clock pulse does not influence the next stage, as is the case for edge-triggered stages 101.

Figure 9:
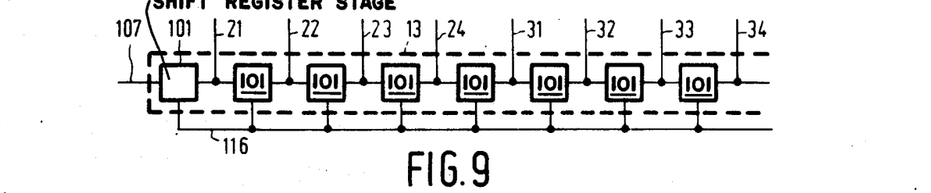
FIG. 9 schematically shows a shift register controlled by a monophase clock signal.

FIG. 9 shows a part of such a register 13 with a clock line 116 ($\psi_1$). This register can furnish the electrodes 21, 22, 23, 24, 31, 32, 33, and 34 with voltages for four-phase transport.

The associated switching behavior is shown in Table 6. It should be noted that the lines $t_0$, $t_1$ etc. indicate the change after activation of the clock $\psi$. The information at the input terminal 107 is presented before clock $\psi$ is activated during each cycle.

TABLE 4

| Instant | Input (107) | Clock | \multicolumn{7}{c}{Electrodes} |
|---|---|---|---|---|---|---|---|---|---|---|

| Instant | Input (107) | Clock | 21 | 22 | 23 | 31 | 32 | 33 | 121 | 122 |
|---|---|---|---|---|---|---|---|---|---|---|
| $t_0$ | 0 | $\psi_3$ | 0 | 1 | 0 | 1 | 0 | 1 | 0 | 1 |
| $t_1$ | 0 | $\psi_1$ | 1 | 1 | 0 | 1 | 0 | 1 | 0 | 1 |
| $t_2$ | 0 | $\psi_2$ | 1 | 0 | 0 | 1 | 0 | 1 | 0 | 1 |
| $t_3$ | 0 | $\psi_3$ | 1 | 0 | 1 | 1 | 0 | 1 | 0 | 1 |
| $t_4$ | 0 | $\psi_1$ | 1 | 0 | 1 | 0 | 0 | 1 | 0 | 1 |
| $t_5$ | 0 | $\psi_2$ | 1 | 0 | 1 | 0 | 1 | 0 | 0 | 1 |
| $t_6$ | 0 | $\psi_3$ | 1 | 0 | 1 | 0 | 1 | 0 | 0 | 1 |
| $t_7$ | 1 | $\psi_1$ | 0 | 0 | 1 | 0 | 1 | 0 | 1 | 1 |
| $t_8$ | 1 | $\psi_2$ | 0 | 1 | 1 | 0 | 1 | 0 | 1 | 0 |
| $t_9$ | 1 | $\psi_3$ | 0 | 1 | 0 | 0 | 1 | 0 | 1 | 0 |
| $t_{10}$ | 0 | $\psi_1$ | 1 | 1 | 0 | 1 | 1 | 0 | 1 | 0 |
| $t_{11}$ | 0 | $\psi_2$ | 1 | 0 | 0 | 1 | 0 | 0 | 1 | 0 |
| $t_{12}$ | 0 | $\psi_3$ | 1 | 0 | 1 | 1 | 0 | 1 | 1 | 0 |
| $t_{13}$ | 1 | $\psi_1$ | 0 | 0 | 1 | 0 | 0 | 1 | 0 | 0 |
| $t_{14}$ | 1 | $\psi_2$ | 0 | 1 | 1 | 0 | 1 | 1 | 0 | 1 |
| $t_{15}$ | 1 | $\psi_3$ | 0 | 1 | 0 | 0 | 1 | 0 | 0 | 1 |
| $t_{16}$ | 0 | $\psi_1$ | 1 | 1 | 0 | 1 | 1 | 0 | 1 | 1 |
| $t_{17}$ | 0 | $\psi_2$ | 1 | 0 | 0 | 1 | 0 | 0 | 1 | 0 |
| $t_{18}$ | 0 | $\psi_3$ | 1 | 0 | 1 | 1 | 0 | 1 | 1 | 0 |

In this embodiment, as well as in the two preceding embodiments, it is assumed that at $t_0$ the input terminals (107) have had a constant value (1 or 0) for a sufficiently long time to provide an electrode potential pattern of 010101.

The registers 13 may also use noninverting stages. Such stages may again be interconnected, for example, by switching elements (transistors).

Figure 10:
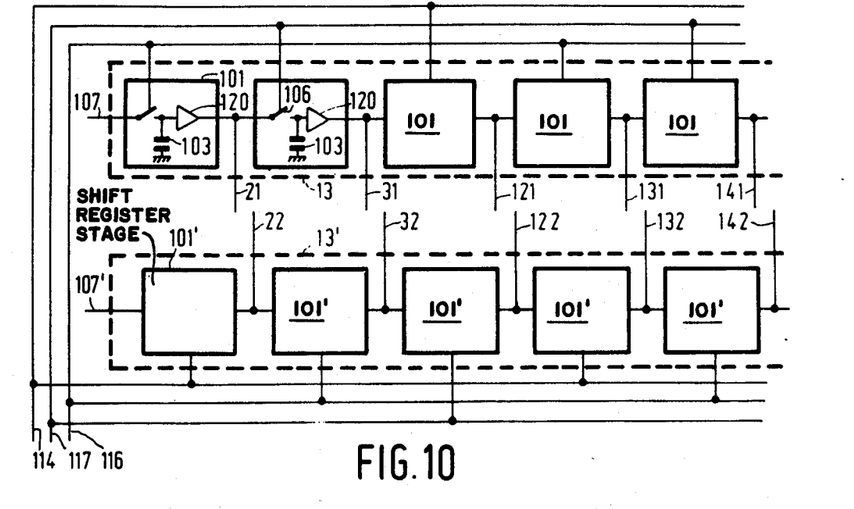
FIG. 10 schematically shows two shift registers comprising non-inverting stages for controlling the device shown in FIG. 2.

A device according to the invention having registers 13 and 13' with noninverting stages 101 and 101' is shown in FIG. 10. In this embodiment, a stage 101 comprises a switching element 106, a noninverting circuit 120, and a capacitance 103. The capacitances 103 are again electrically connected to ground. The inputs and outputs of the stages are connected to electrodes 21, 22, 31, 32, 121, 122, 131, 132, 141, and 142 of an electrode system for charge storage and charge transport, for example in an image sensor part of a device similar to that shown in FIG. 2.

Inter alia, in order to be able to apply alternately low and high potentials to the electrodes 21, 22, 31, 32 ... 141, and 142 during integration, the odd-numbered electrodes 21, 31, 121, 131, and 141, and the even-numbered electrodes 22, 32, 122, 132, and 142 are electrically connected to the output stages of separate registers 13 and 13', respectively. The registers may be arranged, for example, on opposite sides of the electrode system.

Figure 11:
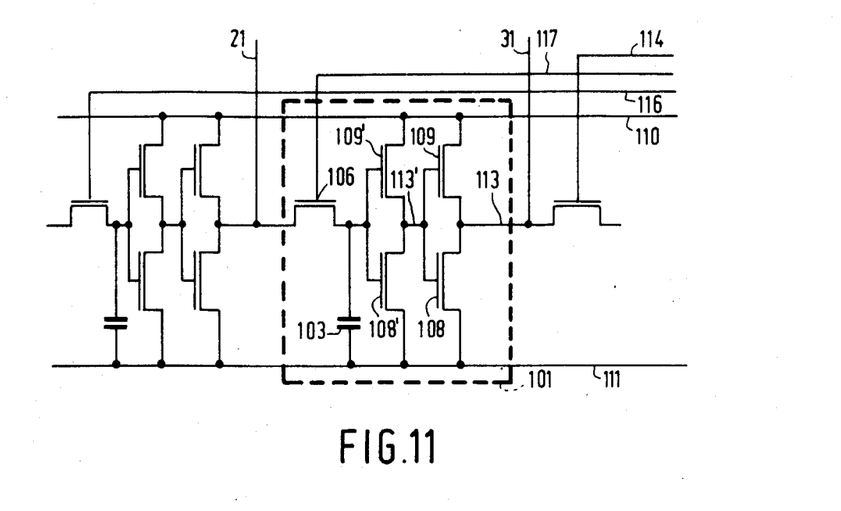
FIG. 11 schematically shows a circuit making up the shift registers of FIG. 10.

A possible complementary MOS circuit for such a register stage 101 is shown in FIG. 11. Two series arrangements of p-type MOS transistors 109 and 109' and n-type MOS transistors 108 and 108' are provided between a supply line 110 and ground 111. The gate electrodes of the transistors 108 and 109, and 108' and 109', respectively, are connected to each other. The sources or drains of the transistors 108 and 109 are connected to the common gate of the transistors 108' and 109'. The point 113 at which the source or drains of the transistors 108 and 109 are connected determines the voltage at one of the electrodes 21, 22 ... 141, and 142. In the embodiment shown in FIG. 11, this point 113 is connected to the electrode 31.

The capacitance 103 may be charged or not charged depending upon the switching behavior of the preceding stage 101 and depending upon signals at the input terminal 107 and the clock pulse lines 116 ($\psi_1$), 117 ($\psi_2$) and 114 ($\psi_3$). The clock pulse lines switch on or off an n-type MOS transistor 106 so that information from the input 107 or a preceding stage may or may not be passed on.

If, for example, in the stage 101 shown in FIG. 11 clock line 117 becomes high, the transistor 106 becomes conducting. The output of 101 and hence and electrode 31 then assumes the voltage of the electrode 21, which is connected to the output of the preceding stage. The electrode 31 changes only if the voltage at the electrode 21 has changed when the clock line 116 bomes high.

Table 7 shows the switching behavior of the electrodes 21, 22, 31, 32, 121, 122, 131, 132, 141, and 142 if the latter are controlled by registers with noninverting stages 101. The odd-numbered electrodes 21, 31, 121, 131, and 141 are then controlled from the register 13 with stages 101 and an input terminal 107. The even-numbered electrodes 22, 32, 122, 132, and 142 are controlled from the register 13' with stages 101' (see FIG. 10).

TABLE 5

| Instant | Clock | Input (107) | 21 | 22 | 23 | 24 | 31 | 32 | 33 | 34 |
|---|---|---|---|---|---|---|---|---|---|---|
| $t_0$ | $\psi_4$ | 0 | 0 | 1 | 0 | 1 | 0 | 1 | 0 | 1 |
| $t_1$ | $\psi_1$ | 0 | 1 | 1 | 0 | 1 | 0 | 1 | 0 | 1 |
| $t_2$ | $\psi_3$ | 0 | 1 | 1 | 0 | 1 | 0 | 1 | 0 | 1 |
| $t_3$ | $\psi_4$ | 0 | 1 | 1 | 0 | 1 | 0 | 1 | 0 | 1 |
| $t_4$ | $\psi_2$ | 1 | 1 | 0 | 0 | 1 | 0 | 1 | 0 | 1 |
| $t_5$ | $\psi_3$ | 1 | 1 | 0 | 1 | 1 | 0 | 1 | 0 | 1 |
| $t_6$ | $\psi_1$ | 1 | 0 | 0 | 1 | 1 | 0 | 1 | 0 | 1 |
| $t_7$ | $\psi_2$ | 1 | 0 | 1 | 1 | 1 | 0 | 1 | 0 | 1 |
| $t_8$ | $\psi_4$ | 0 | 0 | 1 | 1 | 0 | 0 | 1 | 0 | 1 |
| $t_9$ | $\psi_1$ | 0 | 1 | 1 | 1 | 0 | 1 | 1 | 0 | 1 |
| $t_{10}$ | $\psi_3$ | 0 | 1 | 1 | 0 | 0 | 1 | 1 | 0 | 1 |
| $t_{11}$ | $\psi_4$ | 0 | 1 | 1 | 0 | 1 | 1 | 1 | 0 | 1 |
| $t_{12}$ | $\psi_2$ | 1 | 1 | 0 | 0 | 1 | 1 | 0 | 0 | 1 |
| $t_{13}$ | $\psi_3$ | 1 | 1 | 0 | 1 | 1 | 1 | 0 | 1 | 1 |
| $t_{14}$ | $\psi_1$ | 1 | 0 | 0 | 1 | 1 | 0 | 0 | 1 | 1 |
| $t_{15}$ | $\psi_2$ | 1 | 0 | 1 | 1 | 1 | 0 | 1 | 1 | 1 |
| $t_{16}$ | $\psi_4$ | 0 | 0 | 1 | 1 | 0 | 0 | 1 | 1 | 0 |
| $t_{17}$ | $\psi_1$ | 0 | 1 | 1 | 1 | 0 | 1 | 1 | 1 | 0 |

At the instant $t_0$, all even-numbered electrodes 22, 32, 122, 132, and 142 have been high (1) for some time so that charge carriers (electrons generated due to a radiation image) have been integrated under these even-numbered electrodes. The input 107 of the resgister 13 is high (1), but because $\psi_1$ (line 116) is not active, this does not change the first stage of the register 13 or the electrode 21 controlled by the output of this stage. The other stages, which are connected to the clock line 117 ($\psi_2$), are not influence, either, by the activation of $\psi_2$ at $t_0$.

At the instant $t_1$, $\psi_1$ (clock line 116) is high (1). The information at the input terminal 107 which is now high is passed on. The other output and electrodes connected thereto (131, 32, and 142) which could change due to the activation of $\psi_1$, remain unchanged because the inputs of the relevant stages (electrodes 121, 22, and 132) have not changed with respect to the instant $t_0$. The charge which was initially present under the electrode 22 is now present under the electrodes 21 and 22.

13', and hence does not change the potential on the electrode 22.

The clock line 117 ($\psi_2$) does influence the electrode 31 so that the high voltage (1) which the electrode 21 obtained at the instant $t_1$ due to $\psi_1$ (clock line 116) is now passed on to the electrodes 31. The remaining outputs (141 and 122) of stages 101 and 101' controlled by $\psi_2$ still remain unchanged.

At the following instants, such input voltages are supplied at the input terminals 107 and 107' that due to the associated clock pulse pattern at the clock lines 116, 117, and 114 charge transport will take place under an increasing number of electrodes, as clearly appears from Table 7. At the instant $t_9$, the charge, which until then was concentrated under the electrodes 142, is distributed under the electrodes 141 and 142. Thereafter, at the instants $t_{10}$ to $t_{14}$ this charge is shifted to the electrode 131.

TABLE 7

| Instant | Clock | Inputs | | Electrodes | | | | | | | | | |
|---|---|---|---|---|---|---|---|---|---|---|---|---|---|
| | | 107 | 107' | 21 | 22 | 31 | 32 | 121 | 122 | 131 | 132 | 141 | 142 |
| $t_0$ | $\psi_2$ | 1 | 0 | 0 | 1 | 0 | 1 | 0 | 1 | 0 | 1 | 0 | 1 |
| $t_1$ | $\psi_1$ | 1 | 0 | 1 | 1 | 0 | 1 | 0 | 0 | 0 | 1 | 0 | 1 |
| $t_2$ | $\psi_3$ | 0 | 0 | 1 | 0 | 0 | 1 | 0 | 1 | 0 | 1 | 0 | 1 |
| $t_3$ | $\psi_2$ | 0 | 1 | 1 | 0 | 1 | 1 | 0 | 1 | 0 | 1 | 0 | 1 |
| $t_4$ | $\psi_1$ | 0 | 1 | 0 | 0 | 1 | 0 | 0 | 1 | 0 | 1 | 0 | 1 |
| $t_5$ | $\psi_3$ | 1 | 1 | 0 | 1 | 1 | 0 | 1 | 1 | 0 | 1 | 0 | 1 |
| $t_6$ | $\psi_2$ | 1 | 0 | 0 | 1 | 0 | 0 | 1 | 0 | 0 | 1 | 0 | 1 |
| $t_7$ | $\psi_1$ | 1 | 0 | 1 | 1 | 0 | 1 | 1 | 0 | 1 | 1 | 0 | 1 |
| $t_8$ | $\psi_3$ | 0 | 0 | 1 | 0 | 0 | 1 | 0 | 0 | 1 | 0 | 0 | 1 |
| $t_9$ | $\psi_2$ | 0 | 1 | 1 | 0 | 1 | 1 | 0 | 1 | 1 | 0 | 1 | 1 |
| $t_{10}$ | $\psi_1$ | 0 | 1 | 0 | 0 | 1 | 0 | 0 | 1 | 0 | 0 | 1 | 0 |
| $t_{11}$ | $\psi_3$ | 1 | 1 | 0 | 1 | 1 | 0 | 1 | 1 | 0 | 1 | 1 | 0 |
| $t_{12}$ | $\psi_2$ | 1 | 0 | 0 | 1 | 0 | 0 | 1 | 0 | 0 | 1 | 0 | 0 |
| $t_{13}$ | $\psi_1$ | 1 | 0 | 1 | 1 | 0 | 1 | 1 | 0 | 1 | 1 | 0 | 1 |
| $t_{14}$ | $\psi_3$ | 0 | 0 | 1 | 0 | 0 | 1 | 0 | 0 | 1 | 0 | 0 | 1 |

TABLE 6

| Instant | Input (107) | Electrodes | | | | | | | |
|---|---|---|---|---|---|---|---|---|---|
| | | 21 | 22 | 23 | 24 | 31 | 32 | 33 | 34 |
| $t_1$ | 1 | 0 | 1 | 0 | 1 | 0 | 1 | 0 | 1 |
| $t_2$ | 0 | 1 | 1 | 0 | 1 | 0 | 1 | 0 | 1 |
| $t_3$ | 0 | 1 | 0 | 0 | 1 | 0 | 1 | 0 | 1 |
| $t_4$ | 1 | 0 | 0 | 1 | 1 | 0 | 1 | 0 | 1 |
| $t_5$ | 1 | 0 | 1 | 1 | 0 | 0 | 1 | 0 | 1 |
| $t_6$ | 0 | 1 | 1 | 0 | 0 | 1 | 1 | 0 | 1 |
| $t_7$ | 0 | 1 | 0 | 0 | 1 | 1 | 0 | 0 | 1 |
| $t_8$ | 1 | 0 | 0 | 1 | 1 | 0 | 0 | 1 | 1 |
| $t_9$ | 1 | 0 | 1 | 1 | 0 | 0 | 1 | 1 | 0 |

At the instant $t_2$, $\psi_3$ (clock line 114) is high (1). Since the clock line 114 controls the first stage of the register 13', the information of the input terminal 107', which is low (0), is passed on to the output of this stage and hence to the electrode 22. The input terminal 107 has meanwhile also obtained a low signal, but this does not change the electrode 21 because $\psi_1$ is not active. Due to the fact that the electrode 22 becomes low, the charge, which originally was present under the electrode 22, is now present under the electrode 21.

The activation of the clock line 114 ($\psi_3$) could also change the electrodes 121 and 132. However, these electrodes retain their values (0 and 1, respectively) because the outputs of the preceding stages (and the electrodes 31 and 122, respectively,) are unchanged.

At the instant $t_3$, $\psi_2$ (clock line 117) is high. The fact that the input terminal 107' has become high, does not change the output of the first stage 101' of the register The succeeding electrode potentials are not shown in Table 7, but they are analogous to that from $t_9$. In the same manner as described for the device shown in FIG. 2, after the information is read, a 1010101010 pattern (for interlace) can be obtained under the electrodes 21, 22, 31, 32, 121, 122, 131, 132, 141, and 142, by applying a high (1) signal at the input 107 and a low signal at the input 107'. After this pattern is obtained, charge is integrated under the odd-numbered electrodes.

Several variations are also possible in the register 13, both with respect to the construction of the stages and to the technology used. For example, it is possible to use a static shift register, in which the stages comprise, for example, cross-coupled transistors.

Besides, the invention may be applied to numerous charge-coupled semiconductor devices. Such devices include, for example, series/parallel/series memories, the aforementioned delay lines, and multiplexers. It may also be applied to other types of radiation-sensitive devices, for example, to line sensors, such as described in the above-mentioned application entitled "Charge Coupled Device With Parallel Inputs".

Furthermore, in the device shown in FIGS. 10 and 11, the electrodes may be connected to the connection point 113' of the transistors 108' and 109'.

Figure 12:
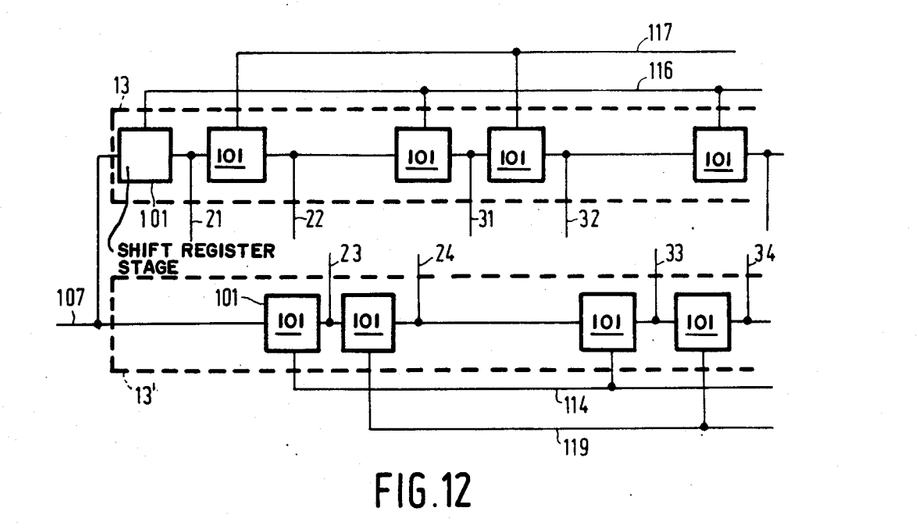
FIG. 12 schematically shows two shift registers comprising inverting stages for controlling a device shown in FIG. 2.

Finally, FIG. 12 shows an embodiment, in which an electrode system 21, 22, 23, 24, 31, 32, 33, 34 . . . , which is suitable for four-phase transport, is controlled by two shift registers 13 and 13'. Registers 13 and 13' have inverting stages which have a common input terminal 107.

The first stage 101 of the shift register 13 is connected to the electrode 21 and is controlled by a clock line 116 ($\psi_1$). The second stage is connected to the electrode 22 and is controlled by the clock line 117 ($\psi_2$). The next two stages are again controlled by the clock lines 116 and 117 and are connected to electrodes 31 and 32.

Similarly, the first two stages 101 of the shift register 13' are connected to electrodes 23 and 24 and are controlled by clock lines 114 ($\psi_3$) and 119 ($\psi_4$). The next two stages of the register 13' are again controlled by the clock lines 114 and 119, and are connected to electrodes 33 and 34.

Thus, the electrodes 21, 23, 31, and 33, which are generally provided in one wiring layer, are driven alternately from the registers 13 and 13'. Thus, wiring problems are avoided, which occur when different electrodes are driven from several stages located beside the electrodes. Moreover, in contrast with the embodiment shown in FIG. 6, it is now not necessary that electrodes of the electrode system are used as throughconnection between stages 101.

The switching behavior of the device shown in FIG. 11 is shown symbolically in Table 8.

TABLE 8

| Instant | Clock | Input (107) | Electrodes | | | | | | | |
|---|---|---|---|---|---|---|---|---|---|---|
| | | | 21 | 22 | 23 | 24 | 31 | 32 | 33 | 34 |
| $t_0$ | $\psi_4$ | 1 | 1 | 0 | 1 | 0 | 1 | 0 | 1 | 0 |
| $t_1$ | $\psi_1$ | 1 | 0 | 0 | 1 | 0 | 1 | 0 | 1 | 0 |
| $t_2$ | $\psi_2$ | 1 | 0 | 1 | 1 | 0 | 1 | 0 | 1 | 0 |
| $t_3$ | $\psi_3$ | 1 | 0 | 1 | 0 | 0 | 1 | 0 | 1 | 0 |
| $t_4$ | $\psi_4$ | 0 | 0 | 1 | 0 | 1 | 1 | 0 | 1 | 0 |
| $t_5$ | $\psi_1$ | 0 | 1 | 1 | 0 | 1 | 0 | 0 | 1 | 0 |
| $t_6$ | $\psi_2$ | 0 | 1 | 0 | 0 | 1 | 0 | 1 | 1 | 0 |
| $t_7$ | $\psi_3$ | 0 | 1 | 0 | 1 | 1 | 0 | 1 | 0 | 0 |
| $t_8$ | $\psi_4$ | 1 | 1 | 0 | 1 | 0 | 0 | 1 | 0 | 1 |
| $t_9$ | $\psi_1$ | 1 | 0 | 0 | 1 | 0 | 1 | 1 | 0 | 1 |
| $t_{10}$ | $\psi_2$ | 1 | 0 | 1 | 1 | 0 | 1 | 0 | 0 | 1 |
| $t_{11}$ | $\psi_3$ | 1 | 0 | 1 | 0 | 0 | 1 | 0 | 1 | 1 |
| $t_{12}$ | $\psi_4$ | 0 | 0 | 1 | 0 | 1 | 1 | 0 | 1 | 0 |

What is claimed is:

1. A charge coupled semiconductor device comprising:
a semiconductor body having a major surface, at least one charge transport channel being defined in the semiconductor body at the major surface;
a system of clock electrodes on the major surface above the charge transport channel; and
a shift register having a plurality of stages, each stage having an input and an output, the output of each stage being electrically connected to the input of the next succeeding stage;
characterized in that:
each clock electrode is directly electrically connected to an input or an output of a shift register stage or to an input/output connection of adjacent shift register stages; and
at least one clock electrode forms the electrical connection between the output of one shift register stage and the input of the next shift register stage.

2. A device as claimed in claim 1, characterized in that the shift register is a dynamic shift register.

3. A device as claimed in claim 2, characterized in that each stage of the shift register comprises:
an inverter circuit having an input; and
a switching transistor connected to the input of the inverter circuit.

4. A device as claimed in claim 3, characterized in that the inverter circuit comprises two complementary MOS transistors.

5. A device as claimed in claim 1, characterized in that the shift register comprises first and second subregisters, the first subregister being arranged on a first side of the charge transport channel, the second subregister being arranged on a second side of the charge transport channel, opposite to the first side.

6. A charge coupled semiconductor device comprising:
a semiconductor body having a major surface, at least one charge transport channel being defined in the semiconductor body at the major surface;
a system of clock electrodes on the major surface above the charge transport channel; and
a shift register having a plurality of stages, each stage having an input and an output, the output of each stage being electrically connected to the input of the next succeeding stage;
characterized in that:
the shift register comprises first and second subregisters, the first subregister being arranged on a first side of the charge transport channel, the second subregister being arranged on a second side of the charge transport channel, opposite to the first side;
each clock electrode is directly electrically connected to an input or an output of a shift register stage, or to an input/output connection of adjacent shift register stages; and
at least one clock electrode forms the electrical connection between the output of one shift register stage on the first side of the charge transport channel and the input of the next shift register stage on the second side of the charge transport channel.

7. A device as claimed in claim 6, characterized in that each subregister is arranged transverse to the charge transport channel.

* * * * *